US010546971B2

(12) United States Patent
de Souza et al.

(10) Patent No.: US 10,546,971 B2
(45) Date of Patent: Jan. 28, 2020

(54) PHOTODETECTOR HAVING A TUNABLE JUNCTION REGION DOPING PROFILE CONFIGURED TO IMPROVE CONTACT RESISTANCE PERFORMANCE

(71) Applicant: International Business Machines Corporation, Armonk, NY (US)

(72) Inventors: Joel P. de Souza, Putam Valley, NY (US); Ning Li, White Plains, NY (US); Devendra Sadana, Pleasantville, NY (US); Yao Yao, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 95 days.

(21) Appl. No.: 15/867,121

(22) Filed: Jan. 10, 2018

(65) Prior Publication Data
US 2019/0214521 A1 Jul. 11, 2019

(51) Int. Cl.
*H01L 31/18* (2006.01)
*H01L 21/265* (2006.01)
(Continued)

(52) U.S. Cl.
CPC .......... *H01L 31/184* (2013.01); *H01L 21/266* (2013.01); *H01L 21/26553* (2013.01); *H01L 31/0304* (2013.01); *H01L 31/1035* (2013.01)

(58) Field of Classification Search
CPC .............. H01L 31/184; H01L 31/1035; H01L 31/0304; H01L 31/03042; H01L 21/26553;
(Continued)

(56) References Cited

U.S. PATENT DOCUMENTS 3,562,022 A * 2/1971 Shifrin .............. H01L 21/26526
438/536
3,718,502 A * 2/1973 Gibbons ................. H01L 21/00
257/655
(Continued)

FOREIGN PATENT DOCUMENTS

| CN | 102867886 A | 1/2013 |
|---|---|---|
| JP | S63032970 A | 2/1988 |
| RU | 2485629 C1 | 6/2013 |

OTHER PUBLICATIONS

Betz et al., "Ion Implanted InSb Photodetectors", IEEE, International Electron Devices Meeting, 1977, pp. 551-554.
(Continued)

*Primary Examiner* — Michael M Trinh
(74) *Attorney, Agent, or Firm* — Cantor Colburn LLP; Vazken Alexanian

(57) ABSTRACT

Embodiments of the invention are directed to a method of forming a semiconductor device. A non-limiting example of the method includes forming a semiconductor material that includes a first type of majority carrier. A doping enhancement layer is formed over a region of the semiconductor material, wherein the doping enhancement layer includes a first type of material. A dopant is accelerated sufficiently to drive the dopant through the doping enhancement layer into the region of the semiconductor material. Accelerating the dopant through the doping enhancement layer also drives some of the first type of material from the doping enhancement layer into the region of the semiconductor material. The dopant within the region and the first type of material within the region contribute to the region having a second type of majority carrier.

20 Claims, 6 Drawing Sheets

(51) Int. Cl.
   *H01L 31/0304* (2006.01)
   *H01L 21/266* (2006.01)
   *H01L 31/103* (2006.01)

(58) Field of Classification Search
   CPC ............. H01L 21/2652; H01L 21/0415; H01L 21/2258; H01L 21/266; H01L 21/2254; H01L 21/2256; H01L 21/2257; H01L 21/26546
   See application file for complete search history.

(56) References Cited

U.S. PATENT DOCUMENTS

| | | | | |
|---|---|---|---|---|
| 3,907,616 | A * | 9/1975 | Wiemer | ............ H01L 21/02129 |
| | | | | 148/DIG. 118 |
| 4,898,834 | A | 2/1990 | Lockwood et al. | |
| 9,093,367 | B2 * | 7/2015 | Liu | .................... H01L 21/2236 |
| 2006/0105554 | A1 * | 5/2006 | Inada | .................. H01L 21/2258 |
| | | | | 438/558 |
| 2008/0090319 | A1 * | 4/2008 | Ginn | .................... H01L 27/144 |
| | | | | 438/48 |

OTHER PUBLICATIONS

Rosbeck et al., "High Performance Be+ Implanted InSb Photodiodes", IEEE, International Electron Devices Meeting, 1981, (pp. 161-164).

* cited by examiner

| SEMICONDUCTOR | $E_g$ (eV) | $T$ (K) | $\lambda_{max}$ (μm) |
|---|---|---|---|
| Si | 1.1 | 300 | 1.1 |
| $In_{0.53}Ga_{0.47}As$ | 0.75 | 300 | 1.65 |
| Ge | 0.66 | 300 | 1.9 |
| Ge | 0.73 | 77 | 1.7 |
| InAs | 0.42 | 77 | 3.0 |
| InSb | 0.23 | 77 | 5.2 |
| $Hg_{0.8}Cd_{0.2}Te$ | 0.09 | 77 | 14 |

FIG. 1

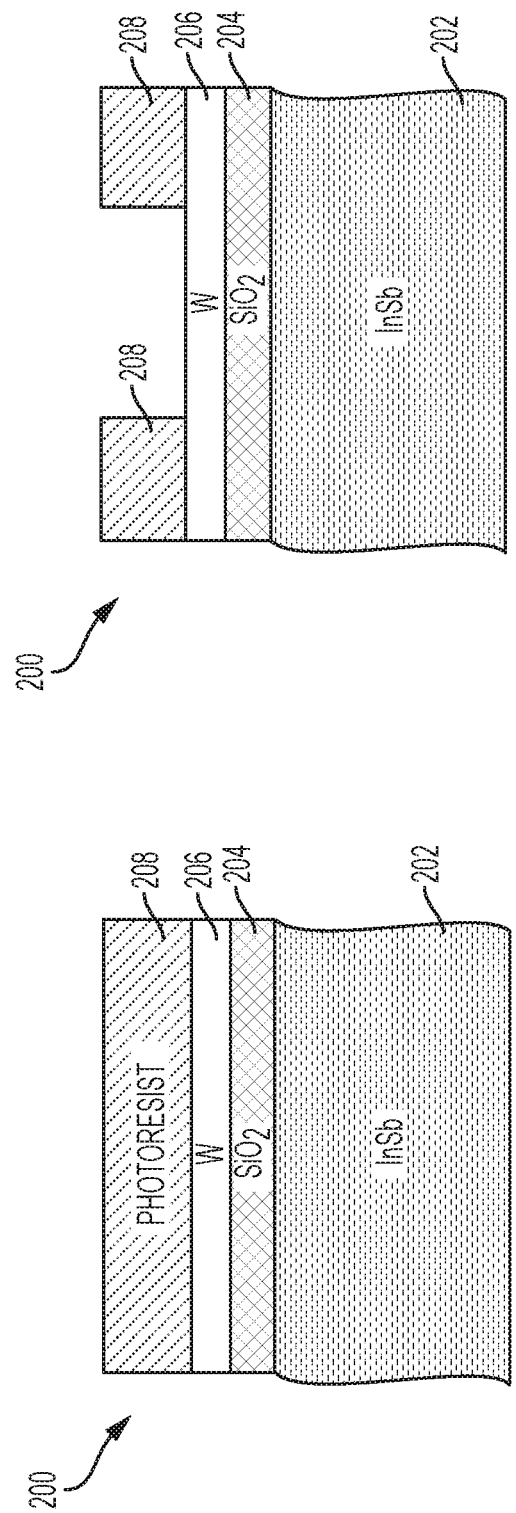
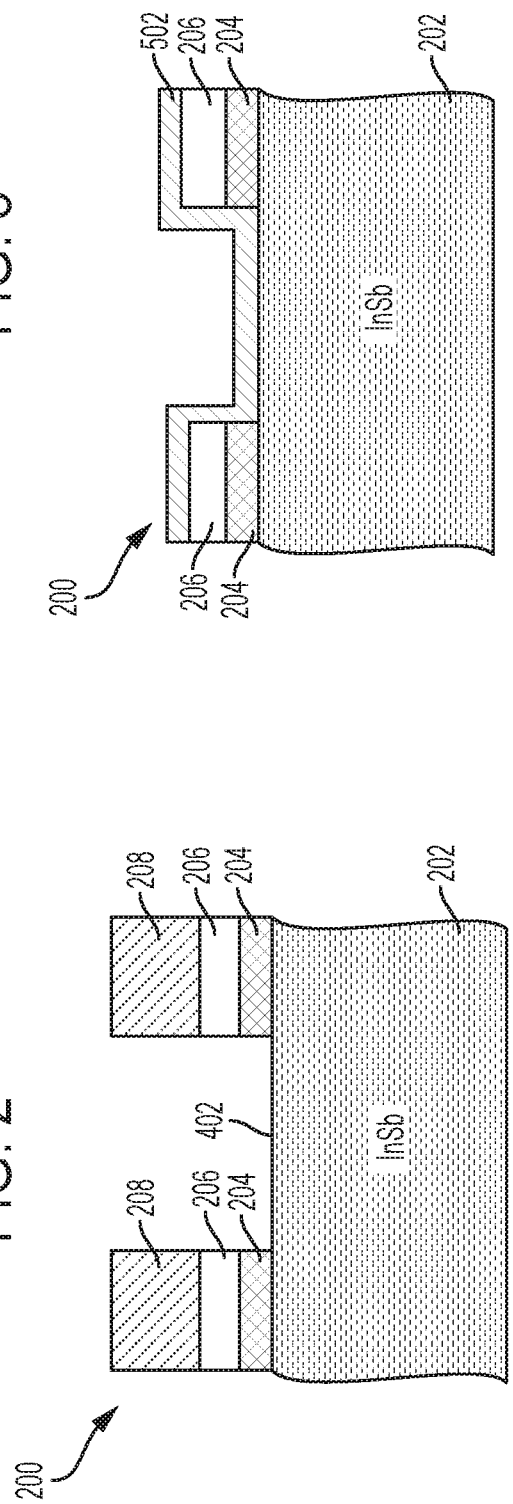

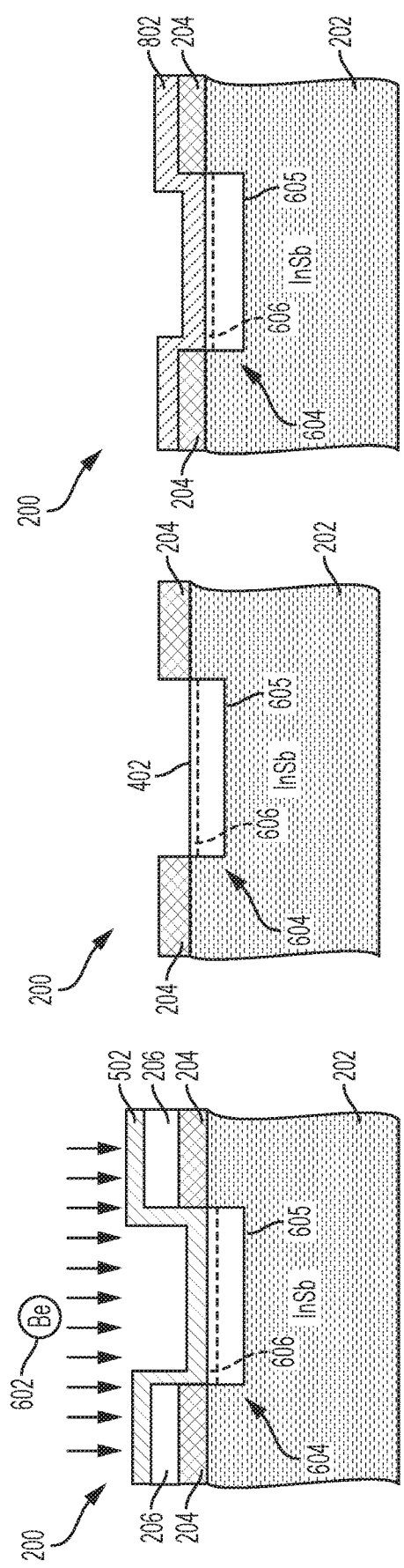
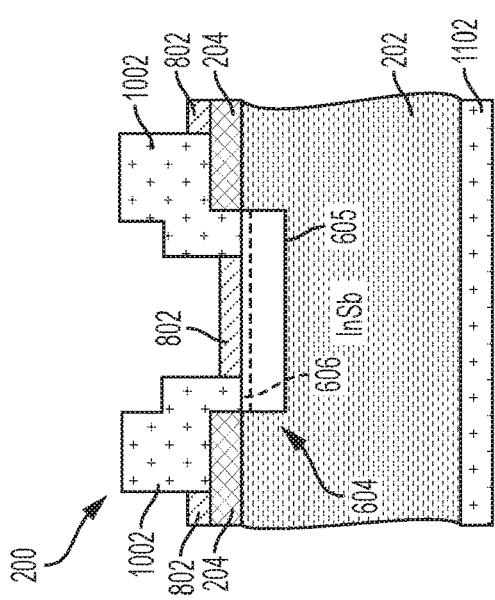
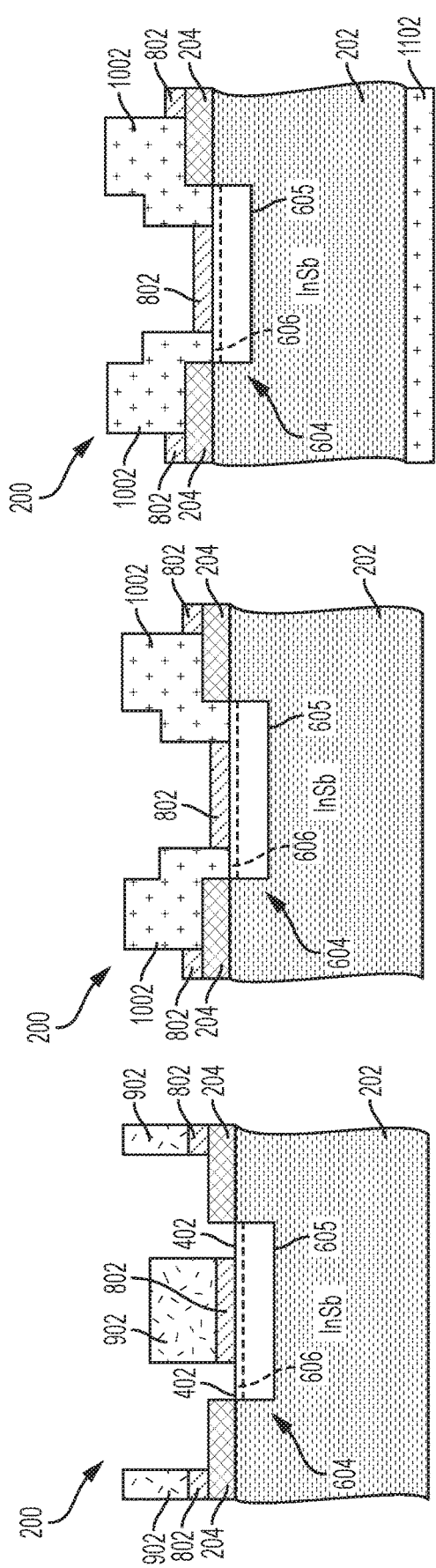

PROJECTED RANGES AND STANDARD DEVIATIONS OBTAINED FROM SRIM SIMULATION FOR EACH PARTICULAR ENERGY. THE OBTAINED Rp AND ΔRp WERE USED TO CALCULATE THE Be PROFILE USING GAUSSIAN APPROXIMATION:

$N(x) = (0.4\ Dose/\Delta Rp) \cdot \exp[-(x-Rp)^2/(2\ \Delta Rp^2)]$

THE TABLE BELOW SHOWS THE PARAMETERS USED TO OBTAIN THE COMPOSED PROFILE SHOWN IN FIGURE BELOW

| ENERGY (keV) | 3 | 10 | 20 | 50 | 200 | 300 |
|---|---|---|---|---|---|---|
| DOSE (cm-2) | 3.00E+12 | 5.50E+12 | 8.00E+12 | 4.80E+13 | 3.00E+10 | 5.50E+10 |
| Rp (A) | 2.10E-06 | 5.32E-06 | 9.25E-06 | 2.03E-05 | 6.24E-05 | 9.64E-05 |
| ΔRp (A) | 1.15E-06 | 2.88E-06 | 4.75E-06 | 9.80E-06 | 2.23E-05 | 2.82E-05 |

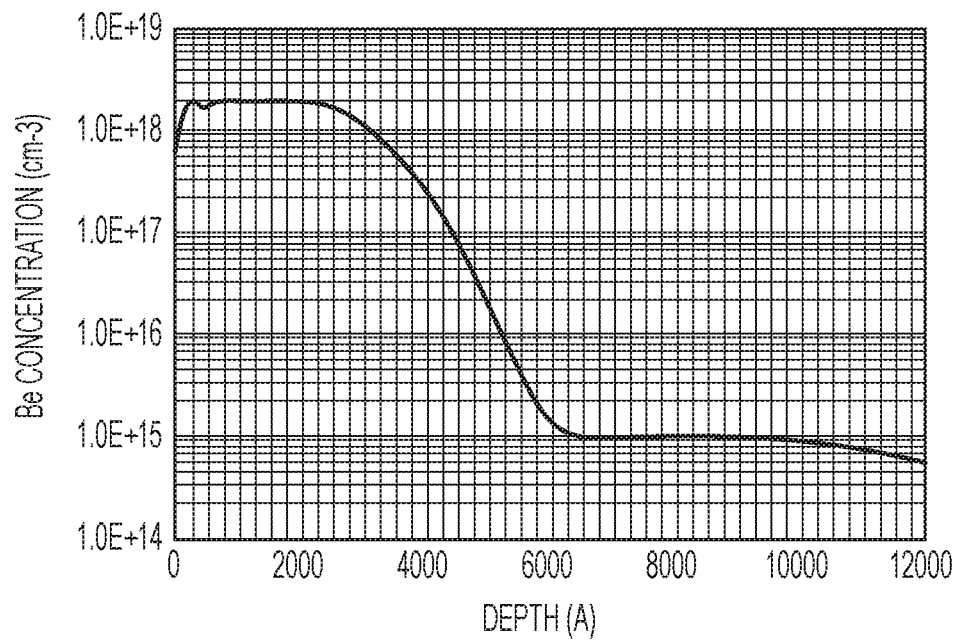

FIG. 12
PRIOR ART

PROJECTED RANGE AND STANDARD DEVIATION OBTAINED FROM SRIM SIMULATION FOR EACH PARTICULAR ENERGY FOR Be ION IMPLANTATIONS THROUGH 50nm THICK ZnO DEPOSITED ON InSb SUBSTRATE. THE PLOT IS FOR Be DEPTH PROFILE INSIDE THE InSb, AFTER REMOVAL OF ZnO FILM.

THE PROJECTED RANGES Rp AND STANDARD DEVIATIONS ΔRp FROM SRIM SIMULATIONS WERE USED TO CALCULATE THE Be PROFILE USING GAUSSIAN APPROXIMATION:

$N(x) = (0.4\ Dose/\Delta Rp) \cdot \exp[-(x-Rp)^2/(2\ \Delta Rp^2)]$

THE TABLE BELOW SHOWS THE PARAMETERS USED TO OBTAIN THE CALCULATED COMPOSED PROFILE IN THE FIGURE BELOW

| ENERGY (keV) | 20 | 50 | 100 | 200 | 350 |
|---|---|---|---|---|---|
| DOSE (cm$^{-2}$) | 2.50E+13 | 5.00E+10 | 8.00E+10 | 8.00E+10 | 1.50E+11 |
| Rp (A) | 7.40E-06 | 1.88E-05 | 3.54E-05 | 6.21E-05 | 9.55E-05 |
| ΔRp (A) | 4.60E-06 | 9.70E-06 | 1.53E-05 | 2.20E-05 | 2.68E-05 |

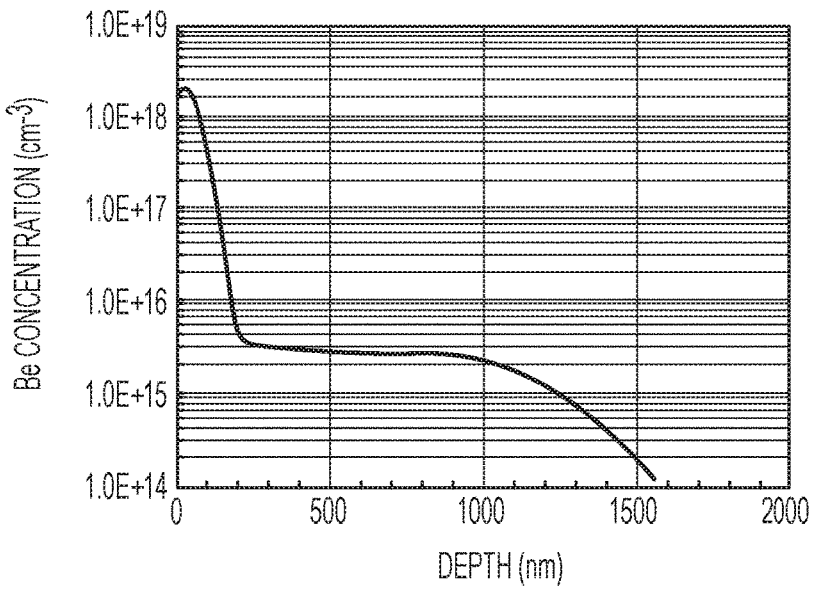

FIG. 13

PHOTODETECTOR HAVING A TUNABLE JUNCTION REGION DOPING PROFILE CONFIGURED TO IMPROVE CONTACT RESISTANCE PERFORMANCE

BACKGROUND

The present invention relates in general to semiconductor devices and their fabrication. More specifically, the present invention relates to improved fabrication methodologies and resulting structures for a photodetector having a junction region doping profile that can be tuned to provide a higher doping concentration adjacent the photodetector contact surface, thereby improving contact resistance.

All objects emit some form of thermal radiation, usually in the infrared (IR) spectrum. IR radiation is invisible to the human eye but can be detected by an IR photodetector (or sensor) that is configured to accept and interpret IR radiation. In a typical IR photodetector, the photodetector absorbs radiation and performs a transducer operation that converts the radiation to a measurable electronic parameter (e.g., voltage, current, resistance, etc.). One type of photodetector uses a solid-state or semiconductor p-n junction. The band gap energy of the semiconductor determines the wavelength(s) of the radiation it can absorb. The p-n junction performs the transducer operation that coverts the radiation absorbed by the semiconductor material into a measurable electronic parameter. Photodetectors are used in many applications. For example, televisions use an IR photodetector to detect and interpret the IR radiation sent from a remote control. The benefits of IR photodetectors include low power requirements, simple circuitry and portable features.

SUMMARY

Embodiments of the invention are directed to a method of forming a semiconductor device. A non-limiting example of the method includes forming a semiconductor material that includes a first type of majority carrier. A doping enhancement layer is formed over a first region of the semiconductor material, wherein the doping enhancement layer includes a first type of material. A dopant is accelerated sufficiently to drive the dopant through the doping enhancement layer into the first region to create a doped first region of the semiconductor material. Accelerating the dopant through the doping enhancement layer also drives some of the first type of material from the doping enhancement layer into the doped first region of the semiconductor material. The dopant within the doped first region contributes to the doped first region comprising a second type of majority carrier, and the first type of material within the doped first region also contributes to the doped first region comprising the second type of majority carrier.

Embodiments of the invention are directed to a method of forming a semiconductor device. A non-limiting example of the method includes forming a semiconductor material that includes a first type of majority carrier. A doping enhancement layer is formed over a first region of the semiconductor material, wherein the doping enhancement layer includes a first type of material. An ion implantation process is applied to accelerate a dopant sufficiently to drive the dopant through the doping enhancement layer into the first region to create a doped first region of the semiconductor material. Applying the ion implantation process to accelerate the dopant through the doping enhancement layer also drives some of the first type of material from the doping enhancement layer into the doped first region of the semiconductor material. The dopant within the doped first region contributes to the doped first region comprising a second type of majority carrier, and the first type of material within the doped first region also contributes to the doped first region comprising the second type of majority carrier.

Embodiments of the invention are directed to a method of forming a semiconductor device. A non-limiting example of the method includes forming a semiconductor material that includes a first surface and a first type of majority carrier. A first portion of the first surface is covered, and a second portion of the first surface is exposed. A doping enhancement layer is formed over the second portion of the first surface of the semiconductor material, wherein the doping enhancement layer includes a first type of material. An ion implantation process is applied to accelerate a dopant sufficiently to drive the dopant through the doping enhancement layer, through the second portion of the first surface of the semiconductor material, and into a first region to create a doped first region of the semiconductor material. Applying the ion implantation process to accelerate the dopant through the doping enhancement layer also drives some of the first type of material from the doping enhancement layer, through the second portion of the first surface of the semiconductor material, and into the doped first region of the semiconductor material. The dopant within the doped first region contributes to the doped first region comprising a second type of majority carrier, and the first type of material within the doped first region also contributes to the doped first region comprising the second type of majority carrier.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIG. 1 depicts a table showing the band gap energy (Eg), temperature (K) and maximum photon absorption wavelength (μm) for various semiconductor materials that can be used to fabricate a photodetector;

FIG. 2 depicts a cross-sectional view of an indium antimonide (InSb) photodetector structure after a fabrication operation according to embodiments of the invention;

FIG. 3 depicts a cross-sectional view of the InSb photodetector structure after a fabrication operation according to embodiments of the invention;

FIG. 4 depicts a cross-sectional view of the InSb photodetector structure after a fabrication operation according to embodiments of the invention;

FIG. 5 depicts a cross-sectional view of the InSb photodetector structure after a fabrication operation according to embodiments of the invention;

FIG. 6 depicts a cross-sectional view of the InSb photodetector structure after a fabrication operation according to embodiments of the invention;

FIG. 7 depicts a cross-sectional view of the InSb photodetector structure after a fabrication operation according to embodiments of the invention;

FIG. 8 depicts a cross-sectional view of the InSb photodetector structure after a fabrication operation according to embodiments of the invention;

FIG. 9 depicts a cross-sectional view of the InSb photodetector structure after a fabrication operation according to embodiments of the invention;

FIG. 10 depicts a cross-sectional view of the InSb photodetector structure after a fabrication operation according to embodiments of the invention;

FIG. 11 depicts a cross-sectional view of the InSb photodetector structure after a fabrication operation according to embodiments of the invention;

FIG. 12 depicts a graph illustrating an example of a junction region doping profile of an InSb photodetector fabricated according known fabrication methodologies that require multiple separate beryllium (Be) ion implantations to form the junction region doping profile;

FIG. 13 depicts a graph illustrating an example of a tuned junction region doping profile of an InSb photodetector, wherein the photodetector was fabricated using a single beryllium (Be) ion implantation through a doping region enhancement layer according to embodiments of the invention;

Figure 14:
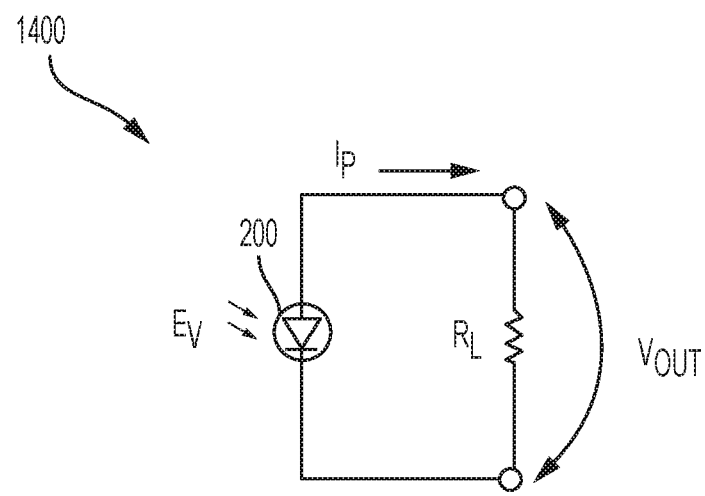
FIG. 14 depicts a simplified circuit capable of incorporating an InSb photodetector fabricated according to embodiments of the invention.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although the examples provided in this written description focus on fabrication operations and resulting structures for a specific IR photodetector configuration, implementation of the teachings recited herein are not limited to a particular photodetector configuration or architecture. Rather the teachings of the present invention are capable of being implemented in conjunction with any other type of photodetector configuration or architecture, now known or later developed. Additionally, although the examples provided in this written description focus on an IR photodetector formed from InSb, the teachings of the present invention can be utilized with other semiconductor materials and combinations of semiconductor materials. Additionally, although examples provided in this written description focus on using a p-n junction when performing the primary transducer function of the photodetector, the primary transducer function can rely on other transducer configurations, including, for example, a p-i-n junction.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, may or may not be used herein for ease of description to describe one element or feature's relationship to another element(s) or feature(s) as illustrated in the figures. Persons skilled in the art will understand that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

Turning now to an overview of technologies that are more specifically relevant to aspects of the present invention, the term "photodetector" is used to identify a category of devices that convert radiation energy (e.g., light) into a measureable electrical parameter (e.g., current, voltage, resistance, etc.). Photodetectors operate based on the photoelectric effect, which has been defined generally as the effect on a circuit due to electromagnetic radiation. More specifically, the photoelectric effect is the effect of radiation on a surface of metal in a vacuum, the result of which is electrons being ejected from the surface. Under the photoelectric effect, radiation (i.e., light) is "converted" to free electrons, which can be processed by the photodetector's transducer element to generate a measureable electrical parameter. Examples of photodetectors include photodiodes, phototransistors, solar cells, and the like. A property of light emitting diodes (LEDs) is that they produce a certain wavelength of light when an electric current is applied. However, LEDs can also function as a photodetector by producing a current when they are subjected to the same wavelength light.

Photodiodes are photodetectors that use a solid-state/semiconductor p-n junction (or a p-i-n junction) as the primary transducer element. Electromagnetic radiation in the form of photon energy (hv) can be absorbed by semiconductor materials based on the band gap energy of the semiconductor, the operating temperature, and the wavelength/energy of the radiation. FIG. 1 depicts a table showing the band gap energy (Eg), the operating temperature (K) and maximum photon absorption wavelength (µm) for various semiconductor materials that are typically used as semiconductor or solid-state photodetectors. In solid-state physics, a band gap is typically an energy range in a solid where no electron states can exist. More specifically, a band gap is the energy difference between the top of the valence band and the bottom of the conduction band of the material. If the valence band is completely full and the conduction band is completely empty, electrons cannot move in the solid. However, if some electrons transfer from the valence band to the conduction band, current can flow. Therefore, the size of the band gap is a major factor in determining the electrical conductivity of a solid. Substances with large band gaps are generally insulators, and substances with smaller band gaps are semiconductors. Substances that are conductors have either very small band gaps or none.

The radiation that a semiconductor absorbs is directly related to the semiconductor's band gap. As the semiconductor band gap increases, the length of the wavelength that can be absorbed at that band gap decreases. As the semiconductor band gap decreases, the length of the wavelength that can be absorbed at that band gap increases. When a photon strikes the photodiode-type photodetector with sufficient energy and wavelength to move electrons from the valance band to the conduction band of the semiconductor, the photon is absorbed and creates an electron-hole pair. This mechanism is also known as the inner photoelectric effect. If the photon absorption occurs in the junction's depletion region, or one diffusion length away from it, these carriers are swept from the junction by the built-in electric field of the depletion region. Thus, holes move toward the anode, electrons move toward the cathode, and a photocurrent is produced. The total current through the photodiode is the sum of the dark current (i.e., current that is generated in the absence of light) and the photocurrent.

A known method of fabricating an InSb photodetector starts with an InSb substrate, which is a naturally n-type material, and uses ion implantation processes to implant p-type dopants (e.g., beryllium (Be)) in the InSb substrate to form a p-type region in the InSb substrate and a p-n junction at the interface between the p-type region and the InSb substrate. An important performance parameter for photodetectors, including specifically the previously-described InSb photodetector, is the contact resistance at the interface between a contact and the p-type region of the InSb substrate. One way to positively impact the contact resistance performance of a photodetector is to attempt to increase the doping concentration near the contact/photodetector interface because a sufficiently high doping concentration near the contact/photodetector interface can reduce the contact resistance.

However, known methods of achieving a sufficiently high doping concentration near the contact/photodetector interface require multiple separate ion implantations operations. It is undesirable to apply multiple separate ion implantations in semiconductor device fabrication processes because ion implantation, while effective, requires countermeasures to address the damage caused by ion implantation to the substrate lattice structure, thus adding complexity to the fabrication process. Additionally, the doping profile created by ion implantation is inherently a Gaussian distribution that peaks at a central portion of the distribution. The desired doping profile for reducing contact resistance peaks near the contact surface and flattens at the central portion of the distribution. Using the known approaches that requires multiple separate ion implantations, it is difficult to control the doping profile to achieve the precise doping profile distribution desired.

Turning now to an overview of aspects of the present invention, embodiments of the invention provide improved fabrication methodologies and resulting structures for a photodetector having a junction region doping profile that can be tuned to provide a higher doping concentration adjacent the photodetector contact surface, thereby improving contact resistance. In embodiments of the invention, the necessary junctions and the desired doping profile can be achieved by depositing a doping region enhancement layer over the substrate and accelerating ions through the enhancement layer into the substrate using, for example, a single ion implantation operation. Although embodiments of the invention do not require more than one ion implantation operation in order to tune the junction region doping profile, in some embodiments of the invention, the enhancement layer could optionally be used in combination with multiple ion implantation operations.

In embodiments of the invention, the enhancement layer is configured to include a doping enhancement element that, if injected into the substrate, would contribute to a desired majority carrier population in the substrate. The desired majority carrier population can be electrons (i.e., n-type) or holes (i.e., p-type) depending on the configuration of the final photodetector. In embodiments of the invention, the enhancement layer can be formed from zinc oxide (ZnO) such that the doping enhancement element is Zinc, which is a p-type dopant. In embodiments of the invention, the accelerated ions are beryllium (Be), which is a p-type dopant.

In embodiments of the invention, the enhancement layer is configured and arranged to allow a percentage of the accelerated ions to substantially pass through the enhancement layer and into the substrate to form a junction region and a junction between the junction region and the remaining portions of the substrate. According to embodiments of the invention, the accelerated ions that pass through the enhancement layer and through the front substrate surface collide with and drive some of the above-described doping enhancement elements from the enhancement layer into the substrate such that the doping enhancement elements can contribute to a desired majority carrier population in the junction region of the substrate. The desired majority carrier population can be electrons (i.e., n-type) or holes (i.e., p-type) depending on the configuration of the final photodetector. In embodiments of the invention, the enhancement layer can be formed from zinc oxide (ZnO) such that the doping enhancement element is Zinc, which is a p-type dopant. Thus, in embodiments of the invention, the doping population in the doping profile includes the accelerated Be ions and the Zn doping enhancement elements from the Zn enhancement layer. Because Be and Zn are p-type dopants, after a sufficient quantity of Be and Zn have crossed the front substrate surface, the majority carriers in the junction region will be p-type. In embodiments of the invention, because the Be dopants and the Zn doping enhancement elements cross the front substrate surface under different processes (primarily direct acceleration vs. primarily indirect collisions), the Be dopants travel deeper into the junction region, and the Zn doping enhancement elements do not. Thus, the Zn doping enhancement elements, according to embodiments of the invention, are concentrated near the front substrate surface. Because the doping concentration in the substrate is higher at the front substrate surface, the resistance is reduced between a contact and the front substrate surface, which improves the contact resistance performance of the photodetector.

In embodiments of the invention, the enhanced concentration of majority carriers (e.g., p-type majority carriers) at the front substrate surface, as well as the depth of the junction region, can be tuned based at least in part on the thickness of the enhancement layer and the percentage concentration of the of the doping enhancement element(s) in the enhancement layer. According to embodiments of the invention, the control and design of the desired doping profile, as well as a lower contact resistance, can be achieved using a simpler and more easily controlled process (e.g., an enhancement layer plus one ion implantation) than known approaches that require the application of multiple ion implantations. Lowering contact resistance using embodiments of the invention improves the efficiency of the resulting photodiode because less energy is required in order to overcome the photodiode's contact resistance.

Turning now to a more detailed description of aspects of the invention, FIGS. 2-11 depict an InSb photodetector device 200 (shown in FIG. 2) after various fabrication stages according to embodiments of the invention. Applying the teachings of the present invention, which are described in detail below, the photodetector 200, when completed, will include an junction region 604 (shown in FIG. 6) having an doping enhancement region 606 (shown in FIG. 6) that is near a front substrate surface 402 (shown in FIG. 4) where a contact 1002 (shown in FIG. 10) will be formed. A doping concentration in the doping enhancement region 606 is higher adjacent the front substrate surface 402. Additional details of the doping concentration in the doping enhancement region 606 are shown in FIG. 11. The higher doping concentration in the doping enhancement region 606 adjacent the front substrate surface 402 lowers the resistance between the contact 1002 and the doping enhancement region 606 of the photodetector 200, which improves the contact resistance performance of the photodetector 200.

In FIG. 2, a film stack is formed that includes a semiconductor substrate 202 (e.g., InSb), a passivation region 204 (e.g., SiO2), a sacrificial metal region 206 (e.g., tungsten (W)), and a photo-resist layer 206, configured and arranged as shown. The various regions/layers 202, 204, 206, 208 that form the film stack of the photodetector 200 shown in FIG. 2 can be formed/deposited using a variety of known semiconductor fabrication processes.

The respective thicknesses of each of the regions/layers 202, 204, 206, 208 that form the film stack of the photodetector 200 can vary according to design considerations. For example, the respective thicknesses of each region/layer 202, 204, 206, 208 can be designed to have predetermined thicknesses, to have thicknesses within predetermined ranges, to have thicknesses having fixed ratios with respect to each other, or to have thicknesses based on any other consideration or combination of considerations in accordance with the various functionalities described herein. In embodiments of the invention, the passivation region 204 can be about 200 nm, the sacrificial metal region 206 can be about 500 nm, and the photo-resist layer 208 can be about 2 μm.

In the illustrated embodiments, the substrate 202 is formed from InSb in order to provide a photodetector 200 that can absorb/detect photon energy in the wavelength and operating temperature ranges shown in FIG. 1. The substrate 202 can be formed using any suitable semiconductor device fabrication technique, including, for example, epitaxial growth. Expitaxially grown InSb is inherently n-type and no doping of the InSb substrate 202 is needed in order to make the substrate 202 n-type. Alternatively, if the InSb substrate 202 is not sufficiently n-type, the InSb substrate 202 can be epitaxial grown containing a suitable n-type dopant. In embodiments of the invention, the substrate 202 can be any semiconductor substrate material that is suitable for the particular application in which the photodetector 200 will be used, including, for example, the various semiconductor materials listed in FIG. 1.

FIG. 2 illustrates a portion of the substrate 202 where a single photodetector 200 will be formed. In embodiments of the invention, multiple instances of the photodetectors 200 can be formed on the substrate 202 to form an array (not shown), which can be communicatively coupled to operate as an integrated circuit (IC), and which can be further configured and arranged to function with additional circuitry (not shown) that processes the electrical parameters output from the array. For example, multiple instances of the photodetectors 200 can be configured and arranged to function as a focal plane array (FPA) (not shown), and can be further configured and arranged to communicatively couple to a readout IC (ROIC) that receives and processes the electrical parameters output from the FPA.

In embodiments of the invention, the passivation region 204 is formed from a dielectric such as SiO$_2$. The passivation region 204 prevents electrical conduction between the substrate 202 and the sacrificial metal layer 206. In embodiments of the invention, the passivation region 204 can be formed/deposited using a variety of known semiconductor fabrication processes, including, for example, a plasma enhanced chemical vapor deposition (PECVD) process.

In embodiments of the invention, the sacrificial metal region 206 can be formed from tungsten (W). The sacrificial metal region 206 substantially blocks accelerated ions from passing through the sacrificial metal region 206 and into the substrate 202. Although not as effective as the sacrificial metal layer 206, to the extent that some accelerated ions pass through the sacrificial metal layer 206, the passivation layer 204 can also substantially block at least some of those accelerated ions from passing through the passivation region 204 and into the substrate 202.

In embodiments of the invention, the photo-resist layer 208 is a light sensitive polymer, which will be used in subsequent lithography fabrication processes to open a front substrate surface 402 (shown in FIG. 4) and define the lateral width of the junction region 604 (shown in FIG. 6). The photo-resist layer 208 can be formed/deposited using a variety of known semiconductor fabrication processes.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a semiconductor device (e.g., photodetector 200) and the many wires that connect the multiple photodetectors of the substrate 202, lithography and etch pattern transfer steps are repeated multiple times. Each pattern being printed on the wafer is aligned to the previously formed patterns and slowly the conductors, insulators and selectively doped regions are built up to form the final device.

In FIG. 3, a portion of the photo-resist layer 208 has been removed using standard photolithographic mask exposure and development techniques (e.g., patterning and lithography, self-aligned double patterning, self-aligned quadruple patterning, etc.).

In FIG. 4, the portions of the sacrificial metal region 206 and the passivation layer 204 not covered by the remaining photo-resist layer 208 have been selectively removed using, for example, a reactive ion etch (RIE) for the sacrificial metal layer 206 and a wet etch for the passivation layer 204. After removal of the portions of the sacrificial metal region 206 and the passivation layer 204 not covered by the remaining photo-resist layer 208, a front substrate surface 402 of the substrate 202 is exposed. A lateral width of the front substrate surface 402 defines a lateral width of an area in the substrate 202 that will form the junction region 604 (shown in FIG. 6).

In FIG. 5, the remaining photo-resist layer 208 has been removed using any suitable photo-resist removal process, and a junction region enhancement layer 502 has been deposited over at least the exposed front surface 402 (shown in FIG. 4). In embodiments of the invention, the enhancement layer 502 is configured to include a doping enhancement element that, if injected into the substrate 202, would contribute to a desired majority carrier population in the substrate 202. The desired majority carrier population can be electrons (i.e., n-type) or holes (i.e., p-type) depending on the configuration of the final photodetector 200. In embodiments of the invention, the enhancement layer 502 can be formed from zinc oxide (ZnO) such that the doping enhancement element is Zinc, which is a p-type dopant. The enhancement layer 502 can be deposited conformally as shown in FIG. 5, using, for example, an atomic layer deposition (ALD) process. The enhancement layer 502 can also be deposited in a more targeted fashion on the front substrate surface 402 using, for example, a sputtering process.

The thickness of the enhancement layer 502 can vary according to design considerations. For example, the thickness of the enhancement layer 502 can be designed to have a predetermined thickness, to have thicknesses within predetermined ranges, to have a thickness having a fixed ratio with respect to other layers of the photodetector 200, or to have thicknesses based on any other consideration or combination of considerations in accordance with the various functionalities described herein. In embodiments of the invention, the thickness of the enhancement layer 502 can be about 100 nm.

In FIG. 6, ions 602 have been accelerated and directed downward toward the front substrate surface 402 (shown in FIG. 4). In embodiments of the invention, the ions 602 can be accelerated toward the substrate 202 using, for example, an ion implantation process. In embodiments of the invention, the ions are beryllium (Be), which is a p-type dopant. In embodiments of the invention, sufficient Be ions are implanted to provide heavy (i.e., Be+) doping.

The enhancement layer 502 is configured and arranged to allow a percentage of the accelerated ions 602 to substantially pass through the enhancement layer 502. However, the passivation region 204 and the sacrificial metal region 206 are configured and arranged to substantially prevent the accelerated ions 602 that have passed through the enhancement layer 502 from entering the portions of the substrate 202 that are underneath the passivation region 204 and the sacrificial metal region 206. Thus, the portion of the enhancement layer 502 that is over the front substrate surface 402 (shown in FIG. 4) allows a percentage of the accelerated ions 602 to substantially pass through the enhancement layer 502 into the substrate 202 to form the junction region 604 and a junction 605 between the junction region 604 and the remaining portions of the substrate 202.

According to embodiments of the invention, the accelerated ions 602 that pass through the enhancement layer 502 and through the front substrate surface 402 collide with and drive some of the above-described doping enhancement elements from the enhancement layer 502 into the substrate 202 such that the doping enhancement elements can contribute to a desired majority carrier population in the junction region 604 of the substrate 202. The desired majority carrier population can be electrons (i.e., n-type) or holes (i.e., p-type) depending on the configuration of the final photodetector 200. In embodiments of the invention, the enhancement layer 502 can be formed from zinc oxide (ZnO) such that the doping enhancement element is Zinc, which is a p-type dopant. Thus, the junction region 604 in the example shown in FIG. 6 includes a doping population that includes the accelerated Be ions 602 and the Zn doping enhancement elements from the Zn enhancement layer 502. Because Be and Zn are p-type dopants, after a sufficient quantity of Be and Zn have crossed the front substrate surface 604, the majority carriers in the junction region 604 will be p-type. In embodiments of the invention, because the Be dopants and the Zn doping enhancement elements cross the front substrate surface 402 under different processes (primarily direct acceleration vs. primarily indirect collisions), the Be dopants travel deeper into the junction region 604, and the Zn doping enhancement elements do not. Thus, the Zn doping enhancement elements, according to embodiments of the invention, are concentrated in a doping enhancement region 606 of the junction region 604. As depicted in FIG. 6, the doping enhancement region 606 is positioned adjacent to the front substrate surface 402. Because the doping concentration in the doping enhancement region 606 is higher adjacent the front substrate surface 402, the resistance is reduced between the contact 1002 (shown in FIG. 10) and the doping enhancement region 606 of the junction region 604, which improves the contact resistance performance of the photodetector 200. Additional details about the doping profile of the doping enhancement region 606 and the junction region 604 are depicted in FIG. 13 and described subsequently in this detailed description.

The enhanced concentration of majority carriers (e.g., p-type majority carriers) in the doping enhancement region 606, as well as the depth of the doping enhancement region 606, can be tuned based at least in part on the thickness of the enhancement layer 502. The enhanced concentration of majority carriers in the doping enhancement region 606, as well as the depth of the doping enhancement region 606, can be further tuned based at least in part on a variety of other parameters, including, for example, the duration and intensity of the Be ion acceleration, the initial Zn percentage selected for the ZnO enhancement layer 502, the lateral width of the front substrate surface 402, the surface area of the front substrate surface 402, and the temperature and duration of the implant activation anneal. These other parameters, along with additional parameters known to those skilled in the art, can be selected and manipulated in order to achieve the desired enhanced concentration of majority carriers (e.g., p-type majority carriers) in the doping enhancement region 606, as well as the desired depth of the doping enhancement region 606.

In FIG. 7, the sacrificial metal region 206 has been removed, and the enhancement layer 502 has been removed. The sacrificial metal region 206 and the enhancement layer 502 can be removed using any suitable semiconductor removal technique. For example, the ZnO enhancement layer 502 can be removed using a wet etch process, and the tungsten sacrificial metal region 206 can be removed using a suitable RIE process.

In FIG. 8, a capping layer 802 has been conformally deposited and an implant activation anneal has been performed. The capping layer 802 has been conformally over the passivation layer 204 and the front substrate surface 402 (shown in FIG. 4). The capping layer 802 can be formed/deposited using a variety of known semiconductor fabrication processes, including, for example, ALD. In embodiments of the invention, the capping layer 802 is formed from $Al_2O_3$. The capping layer 802 provides additional passivation and protects the integrity of the InSb substrate 202 during the implant activation anneal. In embodiments of the invention, the implant activation anneal can be performed using any suitable method, including, for example, furnace annealing or rapid thermal annealing (RTA). Annealing serves to activate the implanted dopants.

In FIG. 9, another photo-resist layer 902 has been deposited, patterned and etched using standard photolithographic mask exposure and development techniques (e.g., patterning and lithography, self-aligned double patterning, self-aligned quadruple patterning, etc.) to define a footprint for the contacts 1002 (shown in FIG. 10). In embodiments of the invention, the photo-resist layer 902 is a light sensitive polymer. The photo-resist layer 902 can be formed/deposited using a variety of known semiconductor fabrication processes.

In FIG. 10, the photo-resist layer 902 (shown in FIG. 9) has been removed using any suitable photo-resist removal process, and the contact 1002 has been formed. In embodiments of the invention, the contact 1002 can be formed using any suitable fabrication technique, including, for example, a metallization and lift-off technique. The footprint contour of the contact 1002 in the cross-sectional view depicted in FIG. 10 is ring-shaped, although any footprint contour can be implemented. The contact 1002 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials.

In FIG. 11, a back-side contact 1102 has been formed on a back surface 1004 (shown in FIG. 10) of the substrate 202. In embodiments of the invention, the back-side contact 1102 can be formed using any suitable fabrication technique, including, for example, a metallization and lift-off technique. The back-side contact 1102 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials.

FIG. 12 depicts a graph illustrating an example of a junction region doping profile of an InSb photodetector fabricated according known fabrication methodologies that require multiple separate beryllium (Be) ion implantations to form the junction region doping profile. The vertical axis shows the Be doping concentration in the substrate, and the horizontal axis, moving from left to right along the horizontal axis, shows the depth from a front substrate surface into the substrate. As shown, multiple ion implantations were required in order to shift the peak of the junction region doping profile toward the front substrate surface of the photodetector.

FIG. 13 depicts a graph illustrating an example of a tuned junction region doping profile of an InSb photodetector fabricated using a single beryllium (Be) ion implantation through a doping region enhancement layer according to embodiments of the invention. The vertical axis shows the Be doping concentration in the substrate, and the horizontal axis, moving from left to right along the horizontal axis, shows the depth from a front substrate surface into the substrate. According to embodiments of the invention, the Be doping concentration shown in FIG. 13 has been tuned and enhanced by driving the Zn doping enhancement elements from the ZnO enhancement layer 502 (shown in FIG. 5). In comparison to the doping profile shown in FIG. 12, the doping profile in FIG. 13 using embodiments of the invention provides a sharper peak doping profile, shifts the peak of the doping profile closer to the front substrate face, and provides a flatter doping profile in the central region of the doping profile.

In embodiments of the invention, the enhanced concentration of majority carriers (e.g., p-type majority carriers) at the front substrate surface, as well as the depth of the junction region, can be tuned based at least in part on the thickness of the enhancement layer 502 (shown in FIG. 5) and the percentage concentration of the of the doping enhancement element(s) in the enhancement layer 502. According to embodiments of the invention, the control and design of the doping profile show in FIG. 13, as well as a lower contact resistance, can be achieved using a simpler and more easily controlled process (e.g., an enhancement layer plus one ion implantation) than known approaches that require the application of multiple ion implantations. Although embodiments of the invention do not require more than one ion implantation operation in order to tune the junction region doping profile, in some embodiments of the invention, the enhancement layer could optionally be used with multiple ion implantations. Lowering contact resistance using embodiments of the invention improves the efficiency of the resulting photodiode because less energy is required in order to overcome the photodiode's contact resistance.

Figure 15:
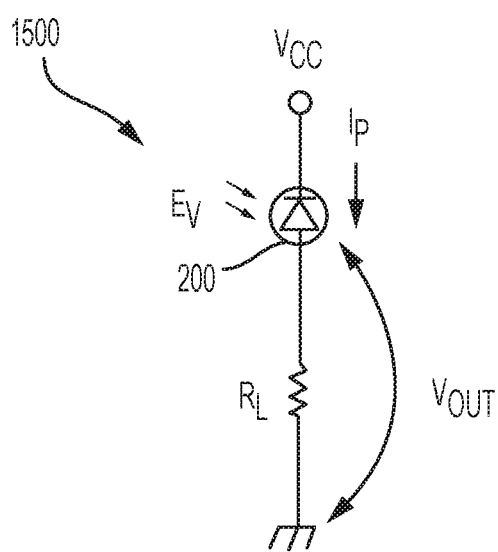
FIG. 15 depicts a simplified circuit capable of incorporating an InSb photodetector fabricated according to embodiments of the invention.

FIGS. 14 and 15 depict simplified examples of circuits 1400, 1500 that can utilize the photodetector 200 shown in FIGS. 2-11. The photodetector 200 in the circuit 1400 is implemented with bias, and the photodetector 200 in the circuit 1500 is implemented with bias. In FIG. 14, the circuit 1400 transforms a photocurrent (Ip) produced by the photodetector 200 without bias into a voltage, which is defined by the equation $V_{OUT}=I_P \times R_L$. $V_{OUT}$ is more or less proportional to the amount of incident light when $V_{OUT}<V_{OC}$, where $V_{OC}$ is the open-terminal voltage of the unbiased photodetector 200. $V_{OUT}$ can also be compressed logarithmically relative to the amount of incident light when $V_{OUT}$ is near $V_{OC}$.

In FIG. 15, the circuit 1500 transforms into an output voltage ($V_{OUT}$) a photocurrent ($I_P$) produced by the photodetector 200, which is reverse-biased by a voltage $V_{CC}$. $V_{OUT}$ is defined by the equation $V_{OUT}=I_P \times R_L$. Similar to the circuit 1400 (shown in FIG. 14), in the circuit 1500, $V_{OUT}$ is more or less proportional to the amount of incident light when $V_{OUT}<V_{OC}$, where $V_{OC}$ is the open-terminal voltage of the unbiased photodetector. However, in the circuit 1500, the region in which $V_{OUT}$ is proportional to the amount of incident light is expanded by the amount of $V_{CC}$ (i.e., in the proportional region, $V_{OUT}<(V_{OC}+V_{CC})$).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming a semiconductor material comprising a first type of majority carrier;
   forming a sacrificial layer over a covered region of the semiconductor material such that a first region of the semiconductor material is exposed;
   wherein the sacrificial layer comprises a sacrificial metal layer and a passivation layer between the sacrificial metal layer and the semiconductor material;
   wherein the passivation layer prevents electrical conduction between the semiconductor material and the sacrificial metal layer;
   forming a doping enhancement layer over the covered region and the first region of the semiconductor material, wherein the sacrificial layer is between the doping enhancement layer and the semiconductor material, wherein the doping enhancement layer comprises a first type of material; and
   accelerating a dopant sufficiently to drive the dopant through the doping enhancement layer and into:
      the sacrificial layer; and
      the first region to create a doped first region;
   wherein accelerating the dopant through the doping enhancement layer drives the dopant into the sacrificial layer but does not drive the dopant through the sacrificial layer into the semiconductor material;
   wherein accelerating the dopant through the doping enhancement layer also drives the first type of material from the doping enhancement layer into the doped first region of the semiconductor material;
   wherein the dopant within the doped first region contributes to the doped first region comprising a second type of majority carrier; and
   wherein the first type of material within the doped first region also contributes to the doped first region comprising the second type of majority carrier.

2. The method of claim 1, wherein:
   the semiconductor material comprises the doped first region and a second region; and
   an interface between the doped first region and the second region comprises a p-n junction.

3. The method of claim 1, wherein:
   the doped first region comprises a doped first sub-region adjacent a first surface of the semiconductor material;
   the doped first region further comprises a doped second sub-region positioned outside of the doped first sub-region; and
   a concentration of the dopant and the first type of material within the doped first sub-region is greater than a concentration of the dopant and the first type of material in the doped second sub-region.

4. The method of claim 1, wherein accelerating the dopant through the doping enhancement layer drives the dopant into the sacrificial metal layer of the sacrificial layer.

5. The method of claim 3 further comprising:
   removing the doping enhancement layer from over the doped first region of the semiconductor material;
   removing at least a portion of the sacrificial layer from over the covered region of the semiconductor material; and
   communicatively coupling a first contact to the first surface of semiconductor material.

6. The method of claim 5 further comprising communicatively coupling a second contact to a second surface of the semiconductor material.

7. The method of claim 1, wherein the semiconductor material comprises indium antimonide.

8. The method of claim 7, wherein the first type of material comprises a first p-type dopant.

9. The method of claim 8, wherein the dopant comprises a second p-type dopant.

10. A method of forming a semiconductor device, the method comprising:
    forming a semiconductor material comprising a first type of majority carrier;
    forming a sacrificial layer over a covered region of the semiconductor material such that a first region of the semiconductor material is exposed;
    wherein the sacrificial layer comprises a sacrificial metal layer and a passivation layer between the sacrificial metal layer and the semiconductor material;
    wherein the passivation layer prevents electrical conduction between the semiconductor material and the sacrificial metal layer;
    forming a doping enhancement layer over the covered region and the first region of the semiconductor material, wherein the sacrificial layer is between the doping enhancement layer and the semiconductor material, wherein the doping enhancement layer comprises a first type of material; and
    applying an ion implantation process to accelerate a dopant sufficiently to drive the dopant through the doping enhancement layer into:
       the sacrificial layer; and
       the first region to create a doped first region;
    wherein accelerating the dopant through the doping enhancement layer drives the dopant into the sacrificial layer but does not drive the dopant through the sacrificial layer into the semiconductor material;
    wherein applying the ion implantation process to accelerate the dopant through the doping enhancement layer also drives the first type of material from the doping enhancement layer into the doped first region of the semiconductor material;
    wherein the dopant within the doped first region contributes to the doped first region comprising a second type of majority carrier; and
    wherein the first type of material within the doped first region also contributes to the doped first region comprising the second type of majority carrier.

11. The method of claim 10, wherein:
    the semiconductor material comprises the doped first region and a second region; and an interface between the doped first region and the second region comprises a p-n junction.

12. The method of claim 10, wherein:
the doped first region comprises a doped first sub-region adjacent a first surface of the semiconductor material;
the doped first region further comprises a doped second sub-region positioned outside of the doped first sub-region; and
a concentration of the dopant and the first type of material within the doped first sub-region is greater than a concentration of the dopant and the first type of material in the doped second sub-region.

13. The method of claim 10, wherein accelerating the dopant through the doping enhancement layer drives the dopant into the sacrificial metal layer of the sacrificial layer.

14. The method of claim 12 further comprising:
removing the doping enhancement layer from over the doped first region of the semiconductor material;
removing at least a portion of the sacrificial layer from over the covered region of the semiconductor material;
communicatively coupling a first contact to the first surface of the semiconductor material; and
communicatively coupling a second contact to a second surface of the semiconductor material.

15. The method of claim 10, wherein the semiconductor material comprises indium antimonide.

16. The method of claim 15, wherein the first type of material comprises a first p-type dopant.

17. The method of claim 16, wherein the dopant comprises a second p-type dopant.

18. A method of forming a semiconductor device, the method comprising:
forming a semiconductor material comprising a first surface and a first type of majority carrier;
covering a portion of the first surface with a sacrificial layer such that a covered portion of the first surface is formed and such that a first portion of the first surface exposed;
wherein the sacrificial layer comprises a sacrificial metal layer and a passivation layer between the sacrificial metal layer and the semiconductor material;
wherein the passivation layer prevents electrical conduction between the semiconductor material and the sacrificial metal layer;
forming a doping enhancement layer over the covered portion and the first portion of the first surface of the semiconductor material, wherein the sacrificial layer is between the doping enhancement layer and the semiconductor material, wherein the doping enhancement layer comprises a first type of material; and
applying an ion implantation process to accelerate a dopant sufficiently to drive the dopant through the doping enhancement layer, through the first portion of the first surface of the semiconductor material, and into a first region to create a doped first region of the semiconductor material;
wherein accelerating the dopant through the doping enhancement layer drives the dopant into the sacrificial layer but does not drive the dopant through the sacrificial layer into the semiconductor material;
wherein applying the ion implantation process to accelerate the dopant through the doping enhancement layer also drives the first type of material from the doping enhancement layer, through the first portion of the first surface of the semiconductor material, and into the doped first region of the semiconductor material;
wherein the dopant within the doped first region contributes to the doped first region comprising a second type of majority carrier;
wherein the first type of material within the doped first region also contributes to the doped first region comprising the second type of majority carrier.

19. The method of claim 18, wherein:
the doped first region comprises a doped first sub-region adjacent the second portion of the first surface of the semiconductor material;
the doped first region further comprises a doped second sub-region positioned outside of the doped first sub-region; and
a concentration of the dopant and the first type of material within the doped first sub-region is greater than a concentration of the dopant and the first type of material in the doped second sub-region.

20. The method of claim 19 further comprising:
removing the doping enhancement layer from over the covered portion and the first portion of the first surface of the semiconductor material;
removing at least a portion of the sacrificial layer from over the covered portion of the semiconductor material;
communicatively coupling a first contact to the first portion of the first surface of the semiconductor material; and
communicatively coupling a second contact to a second surface of the semiconductor material.

* * * * *